United States Patent [19]
Kava et al.

[11] Patent Number: 5,474,649
[45] Date of Patent: Dec. 12, 1995

[54] PLASMA PROCESSING APPARATUS EMPLOYING A TEXTURED FOCUS RING

[75] Inventors: Joseph Kava; Richard J. McGovern; Greg A. Blackburn, all of San Jose, Calif.

[73] Assignee: Applied Materials, Inc., Santa Clara, Calif.

[21] Appl. No.: 208,601

[22] Filed: Mar. 8, 1994

[51] Int. Cl.$^6$ ........................................ H05H 1/00
[52] U.S. Cl. .................. 156/643.1; 156/345; 216/67; 216/71; 118/723 R; 204/298.31
[58] Field of Search .................. 156/345, 643.1; 216/67, 71; 118/728–732, 723 R; 204/298.15, 298.31, 298.01; 414/935

[56] References Cited

U.S. PATENT DOCUMENTS

| | | | |
|---|---|---|---|
| 4,793,975 | 12/1988 | Drage | 422/186.05 |
| 4,975,327 | 12/1990 | Somasiri et al. | 428/409 |
| 5,001,327 | 3/1991 | Hirasawa et al. | 118/729 X |
| 5,246,532 | 9/1993 | Ishida | 156/345 |
| 5,316,620 | 5/1994 | Hasegawa et al. | 156/645 |

*Primary Examiner*—Thi Dang
*Attorney, Agent, or Firm*—Robert W. Mulcahy

[57] ABSTRACT

The invention is directed to a focus ring for surrounding a workpiece/surface substrate during plasma processing comprising a hollow annular assembly comprised of electrically insulating material and having a texturized surface. The texturized ring is preferably in the geometry of a generally cylindrical structure. The texturizing of the ring can be effected by any means of surface abrasion including bead blasting or chemical etching.

12 Claims, 3 Drawing Sheets

PLASMA PROCESSING APPARATUS EMPLOYING A TEXTURED FOCUS RING

FIELD OF THE INVENTION

The invention is directed to a focus ring device for use in a method for plasma processing of a semiconductor workpiece surface/substrate and, in particular, for use in an apparatus and process for plasma etching.

DESCRIPTION OF THE BACKGROUND ART

Semiconductor processing involves a number of different chemical and physical processes whereby minute integrated circuits are created on a substrate. The integrated circuits are constructed using multilayers of interrelated patterns of various materials, the layers being created by such processes as chemical vapor deposition (CVD), physical vapor deposition (PVD), and epitaxial growth. Some layers are patterned using photoresist masks and wet and dry etching techniques. Patterns are created within layers by the implantation of dopants at particular locations. The substrate upon which the integrated circuit is created may be silicon, gallium arsenide, glass, or other appropriate material.

In the production of semiconductor workpieces, plasma etching and reactive ion etching (RIE), both of which employ reactive gas plasma, are presently the most widely used processes to form fine wire patterns in the submicron line width region. In general, plasmas provide higher etch rates, greater anistropy (i.e. more vertical profiles), and lower foreign material concentrations as compared to wet etchants. In plasma etching, a gas (or combination of gases) is ionized to form a plasma. Depending on the conditions of the system (e.g., pressure, power, bias to the electrodes, etc.) as well as the nature of the ions, the exposed material can be etched in a "physical" mode, a "chemical" mode, or a mode that is both physical and chemical. In the physical etch mode, the ions are inert with respect to the exposed materials, but have sufficient energy to physically dislodge atoms from the exposed surface. In the chemical mode, the ions do chemically react with the exposed surface to form gaseous reaction products that are prepared from the chamber. In RIE both physical and chemical etching take place.

In present plasma etching processes requiring submicron patterns, the semiconductor workpiece substrate to be processed is placed on an electrode pedestal and is surrounded by a focus ring which is a cylindrical insulator. The focus ring functions to enhance the uniform application of the etch reaction of the plasma on the surface of the semiconductor workpiece/substrate being processed. Generally the progress of the etching reaction is slower at the center portion of the workpiece than at the peripheral portion thereof. This is due to an "internal loading effect" which refers to the depletion of the etching reaction seeds in the center portion of the workpiece/substrate due to the etching reaction. The focus ring functions to decrease the progress and speed of the etch reaction at the peripheral portion of the substrate, thereby achieving a substantial etching uniformity over the entire workpiece/substrate surface.

Many of the processes carried out within semiconductor processing systems leave contaminant deposits on the elements of the process reactor and the reactor chamber walls which accumulate and become the source of particulate matter harmful to the creation of a semiconductor device. As the geometries of semiconductor devices become ever so smaller, the ability to maintain the uniformity and accuracy of critical dimensions becomes strained. In this dimensional downsizing environment, the avoidance of contaminant particulate matter upon the surface of the semiconductor workpiece has become more critical.

Particulate contamination buildup on semiconductor process chambers and other reactor elements such as focus rings is particularly significant in the etch processing of semiconductor elements employing metal films. These metal films are generally etched by employing a number of reactive gases, including halocarbon gases, as plasma components. In the case of an aluminum film, the etchant gases used are predominantly the chlorine containing gases, chlorine ($Cl_2$) and boron trichloride ($BCl_3$), which enables formation of volatile aluminum chloride compounds upon etching, which volatile compounds can be removed from the etch processing chamber by applied vacuum. However, simultaneously with the formation of volatile aluminum chloride compounds, other active chlorine and boron containing species are formed which can react with any oxygen and water vapor present in the etch processing chamber or with organic species from pattening photoresist to form non volatile particulate compositions which ultimately produce relatively large quantities of contaminant on the inner walls of the process chamber. The non volatile particulate compositions initially tend to remain inside the etch chamber in the form of loosely attached particles to the chamber etch surfaces. These loosely attached etch by-product compounds can easily break free of the surface to which they are attached and fall upon a workpiece/substrate surface causing contamination of the workpiece surface, thereby resulting in a defective device.

This problem of contaminant generation and buildup becomes more acute in metal etch processes employing a focus ring because the proximity of the cylindrical walls shrouding the workpiece favor and enhance deposition and coating of this wall surface with contaminants. Generally, the non-volatile compositions generated in metal etch processes combine with polymeric materials formed from photoresist and carbon containing etchant gases (as by-products of the etch process) and accumulate to form a contaminant coating on the inner wall of the cylindrical focus ring. As the thickness of this contaminant coating increases, stability of the deposited layer decreases due to its weight and/or the stress force exerted on the coating from the curvature of the cylindrical wall, eventually resulting in cracking and excessive particulate flaking or powdering form the coating surface. The powder or flakes drop off the cylindrical walls of the ring thereby causing contamination of the semiconductor workpiece/substrate. As in the case of any semiconductor process system, the apparatus employed in metal etch must be cleaned periodically in order to avoid these problems and, of course, such cleaning requires shutdown of the plasma operation with consequent loss of production.

Known plasma chamber cleaning methods have involved opening the plasma etch chamber, disassembling portions of the chamber, and removing the contaminant deposits by physical of chemical methods. For example, the chamber can be rinsed with a solution of hydrochloric acid, or hand wiped with a solvent, to dissolve various contaminants. The etch chamber alternatively may be washed with water and dried. The same cleaning techniques are separately applied to the vacuum conductance channels and pump system to avoid the inevitable diminished vacuum or suffocation referred to above. All of these cleaning methods are complicated, disruptive, time consuming and can be sources of additional contamination.

Plasma enhanced dry cleaning processes exist whereby contaminants attached to the inside walls of a focus ring or a film deposition reaction chamber are removed by plasma etching using carbon tetrachloride and oxygen. However, presently known plasma enhanced dry cleaning systems require a dry cleaning time period equal to about 5% to 10% of the time spent in the aluminum etching process itself. Moreover, the dry cleaning plasma processes are generally ineffective with respect to the vacuum exhaust system which would have to be separately cleaned. It would clearly be advantageous to delay cleaning of plasma etch process chambers and the present invention effects such a result by providing a focus ring which controls and stabilizes the buildup of contaminant coatings thereon.

Because a focus ring has proximity to the workpiece/surface substrate and, consequently, is more susceptible to contaminant build-up in plasma etch processing, it is desirable to provide a focus ring which accommodates and stabilizes coatings of contaminant residues and requires less frequency of cleaning.

SUMMARY OF THE INVENTION

The present invention is based on the discovery that texturizing the functional surface of a generally cylindrical focus ring enables the formation of substantially uniform and stable coatings on the ring's textured surface in a plasma environment. The texturized surface of the ring provides a roughened surface for a coating formation which reduces stress forces on the coating otherwise presented with smooth surfaces. Consequently, substantially uniform coatings of contaminants deposit on the ring surface in plasma etch environments which coatings are not subject to cracking or fissures because of the reduced stress forces provided by texturizing. The present invention extends the time period between semiconductor reactor process chamber cleaning otherwise required in presently known semiconductor processing systems which use untexturized or smooth surfaced focus rings.

The instant invention is primarily directed to a focus ring for surrounding a workpiece/surface substrate during plasma processing comprising a hollow annular assembly comprised of electrically insulating material and having a texturized surface. The ring is preferably in the geometry of a cylindrical structure and texturized over the entire surface of the ring. The texturizing of the ring can be effected by any means of surface abrasion such as etching or molding including bead blasting, chemical etching, or use of a sculptured mold. The insulating materials of which the instant focus ring is formed can be any engineering plastic or ceramic including polycarbonate resins, polypropylene resins, ceramic compositions (i.e. $Al_2O_3$), and quartz.

The present invention is further directed to a semiconductor plasma processing apparatus for processing workpieces comprising:

a) a semiconductor processing chamber having a reactive gas inlet and a reactive gas outlet;

b) an electrode disposed in the processing chamber for supporting a workpiece/surface substrate;

c) an power supply connected to the substrate supporting electrode; and d) a focus ring for surrounding the substrate comprising a hollow annular assembly comprised of insulating material and having a texturized surface.

And the instant invention is still further directed to a method for plasma processing of a workpiece/surface substrate comprising:

a) placing a workpiece/surface substrate to be processed on an electrode disposed in a plasma reactor chamber;

b) surrounding the workpiece/surface substrate with a focus ring comprised of a hollow annular assembly further comprised of insulating material and having an inner texturized surface;

c) evacuating said reactor chamber and introducing reactive gas into the chamber; and d) generating a plasma in the chamber by applying power to the substrate supporting electrode whereby the workpiece/surface substrate is effected by the plasma generated reactive gases.

DETAILED DESCRIPTION OF THE INVENTION

The present invention is directed to a focus ring useful in the control of contaminants in the plasma processing of semiconductor workpieces. The focus ring of the present invention is particularly useful in controlling contaminant coating buildup on the ring during the plasma etch of metallic workpieces. The instant focus ring is described in the following preferred embodiments in terms of the various texturized surfaces of both the inner and outer walls of the ring and the use of the ring as part of a plasma etch apparatus and process to achieve control of contaminant coating buildup on the surfaces of the ring. However, the concept of employing any form of focus ring in which the entire surface is texturized or physically altered to accommodate a stable coating of plasma etch by-product buildup is applicable to semiconductor process chambers employing focus rings in general. For example, contaminant control is important for focus rings used for chemical vapor deposition, epitaxial growth, and dopant implantation a well as focus rings used in metal etching.

Figure 1:
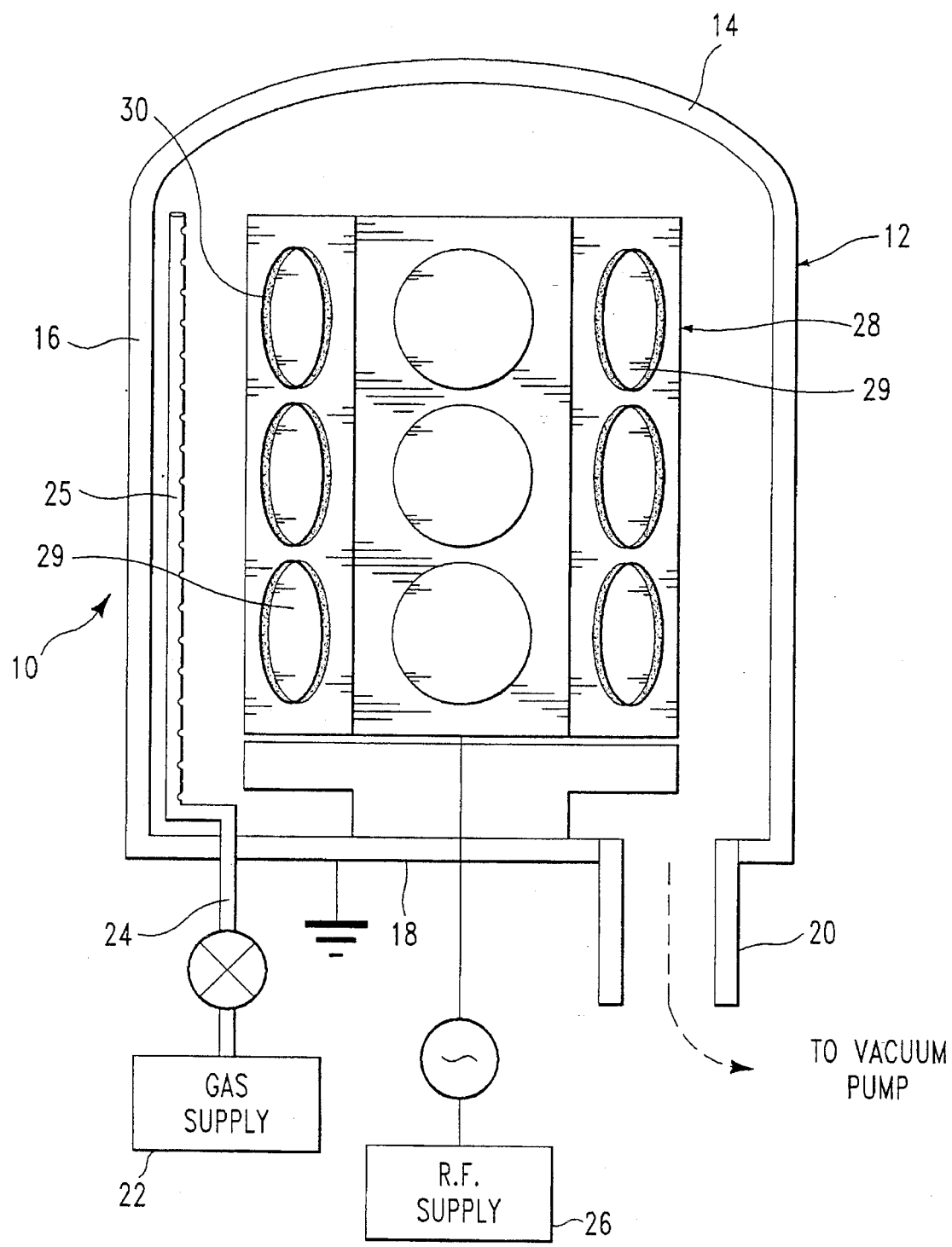
FIG. 1 is a vertical cross sectional view of a plasma etch apparatus utilizing the texturized focus ring of the instant invention.

FIG. 1 illustrates a plasma etching apparatus 10 employing the instant focus ring invention. This is a reactive etching mode system available commercially from Applied Materials, Inc. of Santa Clara, Calif. Plasma etching apparatus 10 includes a cylindrical metal reaction chamber 12 comprising a top portion 14, sidewalls 16 and a baseplate 18, with a connection 20 to a vacuum pump (not shown) for partially evacuating the interior of the chamber. Gas supply 22 is connected to chamber 12 to supply reactant gas to the chamber through valve and conduit arrangement 24 to gas distribution tubes 25 (only one shown) extending vertically from the bottom of the chamber. A hexagonal cathode 28 is connected to an RF power supply 26. Hexagonal cathode 28 is in the form of a surface workpiece holder accessible for mounting workpieces 29 thereon for etch processing. Each surface of hexode cathode 28 in FIG. 1 is designed to have three 6-inch wafer workpieces mounted thereon. The walls of plasma etch chamber 12, including sidewalls 16, top portion 14 and baseplate 18 form the grounded anode of the apparatus. In accordance with the present invention, additionally mounted in each of the three holders on the six faces of the hexagonal cathode 28 is a texturized cylindrical focus ring 30 in accordance with the present invention.

Figure 2:
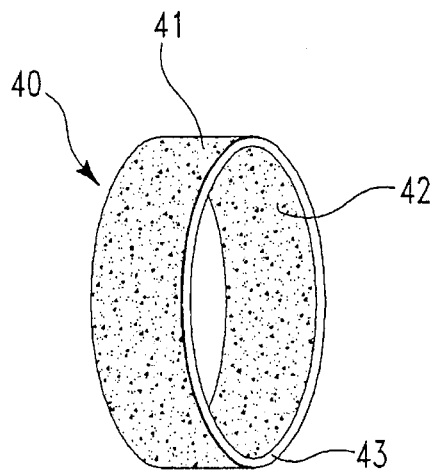
FIG. 2 is a perspective view of a cylindrical focus ring for surrounding a workpiece/surface substrate in accordance with the present invention.

FIG. 2 shows the basic embodiment of the focus ring invention in the form of a generally cylindrical hollow ring structure indicated by reference numeral 40. The ring has an outer cylindrical wall 41 and an inner surface 42. The thickness of the ring 43 as well as the depth, or height, are arbitrary and non-critical parameters dependant on the material used for the ring and/or the particular etch process in which it is to be used. The ring may also contain a fastening aid such as an internal or external flange (not shown) but such a flange element is optional in that the focus ring 40 is completely operable when seated on a pedestal and functionally surrounding a workpiece in a plasma process without any flange or fastening means. Focus ring 40 is comprised of electrically insulating material in the form of engineering plastics or engineering ceramics such as thermoplastic organic polymers, graphite, ceramics and quartz. Typical organic polymers include polycarbonates and polypropylene resins. A preferred resin is thermoplastic polycarbonate sold as Lexan by the General Electric Company. Typical ceramic insulators include amorphous sapphire ($Al_2O_3$), pyrex glass, and other aluminum oxides.

It is preferable that the entire functional surface of the focus ring 40 of FIG. 2 be texturized in that a pattern or finish is imparted to the original insulating surface comprised of inner wall 42 and outer wall 41. It is entirely within the spirit and scope of the invention to employ a partially texturized focus ring the functional surfaces of which are entirely texturized so as to be operable within the purview of the present invention during plasma etching. The use of "texturize" within the purview of the present invention means imparting to the entire ring surface (inner and outer surface wall 42 and 41 of FIG. 2) any pattern, characteristic, or profile which alters the inner surface topography of the insulator focus ring so as to reduce stress forces on any coating formation thereon, as will be demonstrated hereinafter. This texturizing enables the formation of more stable coatings on inner and outer wall surfaces 42 and 41 of focus ring 40 than would be otherwise possible with an untreated or untexturized surface. Textures such as "matte", "satin", or "silk screen" can be imparted by well known texturizing methods to these focus ring surfaces to achieve the favorable coating results obtained with the focus ring 20 of the present invention. The surface texturizing can be also characterized by pits, bumps or nodules which can be achieved by other texturizing methods such as bead blasting or electrolytic deposition. The entire surface of focus ring 40 is texturized as demonstrated because when used in a plasma etching device such as that of FIG. 1, contaminant deposition and buildup, generated in the etch process, occurs on the inner wall 42 or the outer wall 41 or any edge surface, such as 43, of the focus ring 40. All such contaminant coated surfaces are sources of contamination of semiconductor workpieces processed in an apparatus shown in FIG. 1. Consequently, the entire surface of the instant focus ring requires texturization to stabilize such contaminant buildup anywhere on the surface of the ring.

Figure 3:
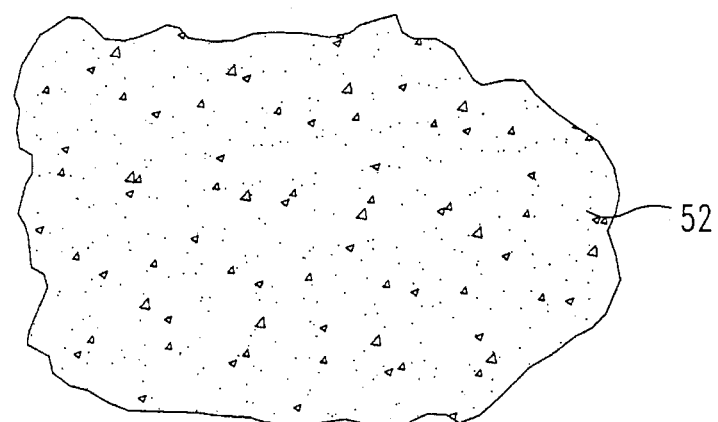
FIG. 3 is a sectional view of one texturized surface embodiment of the instant focus ring.
Figure 4:
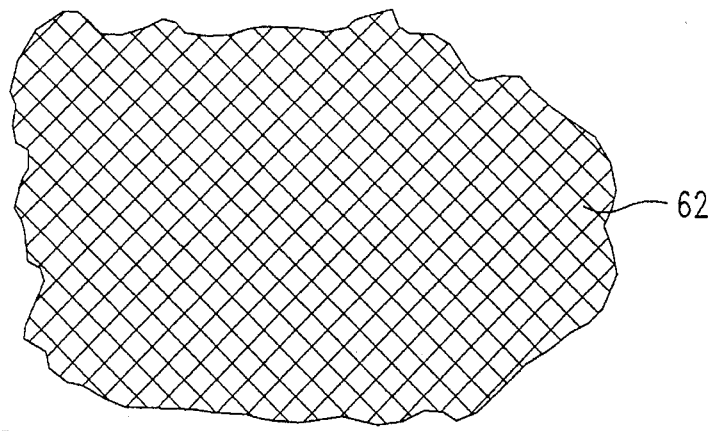
FIG. 4 is a sectional view of another texturized surface embodiment of the present focus ring invention.

In FIGS. 3 and 4 there are demonstrated two different texturized inner surface embodiments of the present focus ring invention. In FIG. 3 there is shown a cut-away view of inner surface 42 of FIG. 2 demonstrating a pitted pattern texturized surface 52 which was prepared by bead blasting the entire original surface of focus ring 40 shown in FIG. 2. This is a random pattern which creates a surface topography suitable for the formation of more stable coatings than would be otherwise possible with the untreated original surface. FIG. 4 additionally shows a cut-away view of another texturized surface of inner wall 42 of focus ring 40 of FIG. 2. In FIG. 4 there is demonstrated a micropatterned line configuration 62 which can be prepared by geometrically engraving, etching, or molding a male or female micropattern surface having from about 50 to 350 repeating geometric units or lines per inch, measured longitudinally across or circumferentially about the inner and outer cylindrical wall surfaces.

As can be appreciated by those skilled in the art, the texturized surfaces of the instant focus ring may be in the form of texturized coatings or films applied to the entire surface of the ring. For example, focus ring wall surfaces 41 and 42 of FIG. 2 may comprise a coating of a highly crystalline polypropylene which has been texturized with a micropatterned line configuration demonstrated as the focus ring surface 62 in FIG. 4. Any functional coating known to those skilled in the art are operable in the present focus rings useful in plasma processing.

Figure 5:
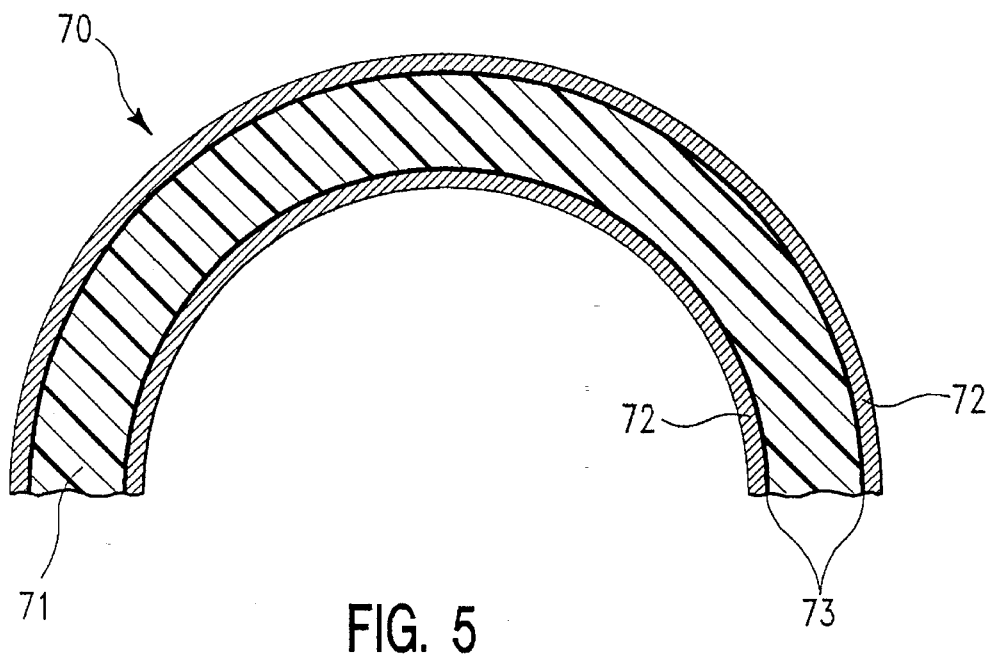
FIG. 5 is a cross-sectional view of a stabilized formation of a contaminant coating on the inner texturized surface of the instant focus ring invention.
Figure 6:
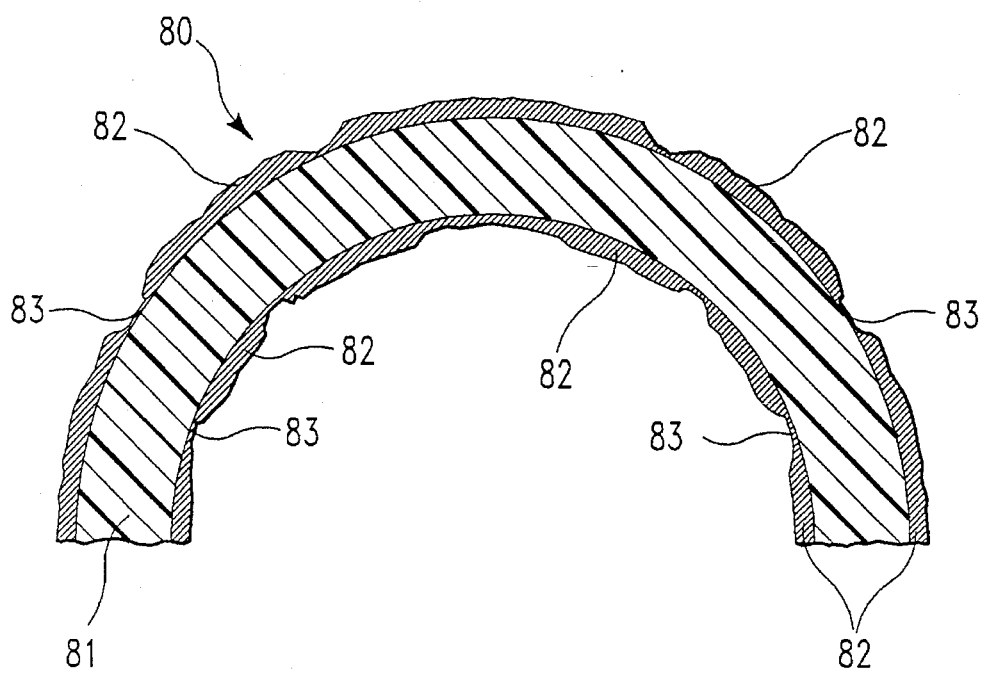
FIG. 6 is a cross-sectional view of a destabilized formation of a contaminant coating on untexturized inner surfaces of prior art focus rings.

In FIGS. 5 and 6 there is shown hemispherical sectional views of the present focus ring and that of the prior art having coatings thereon. In FIG. 5 there is shown the partial focus ring 70 having a curved partial cylindrical structure 71 and a relatively uniform coating 73 on both the inner and outer surfaces of the ring which surfaces have been texturized prior to coating formation. The texturized surfaces are exaggeratedly shown as interface layer 73 for illustration. In FIG. 6 prior art untexturized focus ring 80 is demonstrated as having a cylindrical wall and a contaminant coating 82 on both the inner and outer surfaces of the ring which coating is replete with fissures and cracks because the curvature of the ring causes stress forces to increase as coating formation advances thereby resulting in cracking, fissuring and flaking of the coating. This condition of the focus ring in a plasma etch environment such as that of FIG. 1 would render it an unacceptable source of contamination of the workpiece/substrate surface being worked. In the absence of the texturized surface 73 demonstrated in FIG. 5, the particulate contaminants flaking from the cracks 83 of FIG. 6 would likely fall from the focus ring in relatively large quantities either directly onto the surrounded workpiece or into the general environment of neighboring workpieces where they would migrate to and contaminate such workpieces. The only remedy for such a flaking condition of FIG. 6 is shut down of the plasma apparatus and cleaning of the chamber and/or replacement of the focus ring.

Figure 7:
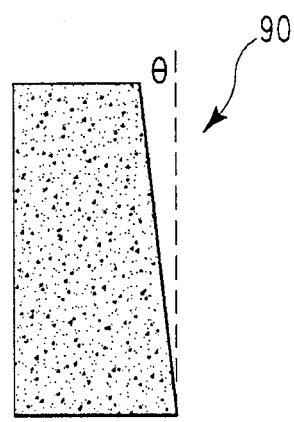
FIG. 7 is a side view of a specific embodiment of the instant texturized focus ring.

FIG. 7 demonstrates a side view of a particular focus ring 90 of a generally cylindrical structure in which one planar end of the annular ring is biased at an angle θ from the plane (shown as a vertical plane) of the other end of the ring or tube. Pedestal rings on high capacity etching machines such as that illustrated in FIG. 1 are mounted at angles from the vertical so as to exploit gravity in the support of the wafer workpieces on these rings and, accordingly, focus rings for use in such plasma devices should be angularly constructed as in FIG. 7. This angular focus ring embodiment 90 is constructed to offset and compliment the angle of the pedestal ring mounting so that plasma will communicate efficiently and effectively with the focus ring 90 and the shrouded wafer (not shown); i.e. an offset focus ring from the plasma source will result in unfocused etching. Other high capacity, automatic autoloading systems are disclosed in U.S. Pat. No. 5,224,809 (issued Jul. 6, 1993 to Applied Materials, Inc.) the disclosure of which is hereby incorporated by reference. This patent demonstrates pedestal rings mounted to hexode frames at approximately 3° from the vertical and, consequently, focus ring 90 of FIG. 7 would have an equal angle ($\theta=3°$) as an embodiment of this focus ring invention to function in that patented invention.

By way of illustration of the instant focus ring invention in a plasma etching chamber similar to that described and shown in FIG. 1, texturized focus rings 30 and wafers 29 are mounted on the hexagonal cathode 28. The chamber may be maintained at a temperature of 60° C., while a 90 volume percent of $BCl_3$ gas and $Cl_3$ gas is flowed into the chamber at a rate of 120 sccm while the chamber is evacuated through a vacuum pump to maintain the pressure in the chamber below 100 millitorr to effect reactive ion etching. A plasma powered by an RF energy source can be ignited in the chamber and maintained at a power level of 1400 watts during the bombardment of the wafer. After 40 minutes the plasma may be extinguished and the gas flow terminated.

After completion of the etch process, the entire surface (both inner and outer walls of the ring) of the mounted focus rings will be found to have deposited thereon a uniform adherent layer of contaminant material in a thickness of about 1000 Angstroms without any noticeable cracking or flaking. The condition of the focus rings enables their continued and prolonged use in the chamber without presenting a source of contamination for the enclosed wafer workpiece.

As indicated the instant texturized focus rings can be prepared by any methods which treat and texturize the surface of the ring in the manner described herein. Bead blasting a ring comprised of an engineering resin is one such process. To illustrate, a polycarbonate ring of about 6 inches in diameter, two inches high, and about 1/8th inch thickness is provided. A blasting nozzle of 13/64 to 1/4 inch diameter and air pressure of 70 to 80 pounds per square inch (PSI) is aligned at an angle of from 60° to 90° from the inside surface of the ring. Blasting commences at a distance of form 2½ to 3½ inches from the surface of the ring using 1/8 inch diameter plastic beads. The blasting continues until a uniform matte surface is produced throughout the entire 360° of the inner surface of the ring. The outside of the ring is treated in the same manner until the entire exposed area of the cylindrical ring is texturized in a light matte finish of 125 to 600 microinches root mean square (RMS). The ring is then air blown and washed with isopropyl alcohol to remove residual particles and other contaminant matter.

The above illustrations indicate that employing the texturized focus rings of the present invention will result in an improved contaminant control than otherwise obtainable with untexturized focus rings in that the uniform coating on the inner ring surface will more effectively prevent residue flaking onto a semiconductor workpiece during etch processing. Moreover, these rings will work more efficiently in that uniform coating of contaminant can be allowed to accumulate without contaminant risk to the workpiece and the texturized ring will require cleaning or replacement less often than ordinarily expected with an untexturized ring.

Having described the invention, it will be apparent to those skilled in the art that various modifications can be made within the scope of the present invention. For example, the process configuration of FIG. 1 is exemplary as to the particular plasma processing systems demonstrated and described herein and other semiconductor processing systems can employ the texturized focus ring of the present invention.

We claim:

1. A method for plasma processing of a semiconductor workpiece comprising:

a) placing a semiconductor workpiece to be processed on an electrode disposed in a plasma reactor chamber;

b) surrounding the workpiece with a focus ring comprised of a hollow annular assembly further comprised of insulating material and having a texturized surface;

c) evacuating said reactor chamber and introducing reactive gas into the chamber; and d) generating a plasma in the chamber by applying power to the substrate supporting electrode whereby the workpiece is processed by the plasma generated reactive gases and a stable coating of plasma generated particulate material is formed on the texturized surface of the focus ring.

2. The method of claim 1 wherein the focus ring is a substantially cylindrical structure and is texturized in a pitted configuration.

3. The method of claim 2 wherein the focus ring surrounding the semiconductor workpiece is comprised of material selected from the group of engineering resins or engineering ceramics consisting essentially of polycarbonate resins, ceramic materials, and quartz materials.

4. The method of claim 3 wherein the focus ring is a polycarbonate resin and one planar end of the substantially cylindrical ring is biased at an angle of about 3° from the plane of the other end.

5. A semiconductor plasma processing apparatus for processing workpieces comprising:

a) a semiconductor processing chamber having a reactive gas inlet and a reactive gas outlet;

b) an electrode disposed in the processing chamber for supporting a semiconductor workpiece;

c) power supply connected to the substrate supporting electrode; and d) a focus ring for surrounding the workpiece comprising a hollow annular assembly comprised of insulating material and having a texturized surface to enhance the stability of plasma generated residual coatings formed on said surface.

6. The apparatus of claim 5 wherein the focus ring is a substantially cylindrical structure and is texturized in a pitted configuration.

7. The apparatus of claim 6 wherein the insulating material of the focus ring is selected from the group of engineering resins or engineering ceramics consisting essentially of polycarbonate resins, polypropylene resins, ceramic materials, and quartz materials.

8. The apparatus of claim 7 wherein the focus ring is a polycarbonate resin and one planar end of the substantially cylindrical ring is biased at an angle of about 3° from the plane of the other end.

9. A focus ring for surrounding a semiconductor workpiece in a plasma processing apparatus comprising a hollow annular assembly of a substantially cylindrical structure comprised of insulating material and having a texturized surface in the form of a micropatterned line configuration to enhance the stability of plasma generated residual coatings formed on said surface.

10. The focus ring of claim 1 wherein the micropattern surface contains from about 50 to 350 lines or repeating geometric units per inch.

11. The focus ring of claim 1 wherein the texturized surface is a texturized coating on the annular insulator surface.

12. The focus ring of claim 1 wherein one planar end of the annular ring structure is angularly biased from the plane of the other end of the annular ring structure.

* * * * *